United States Patent [19]

Giess et al.

[11] 4,070,658
[45] Jan. 24, 1978

[54] ION IMPLANTED BUBBLE PROPAGATION STRUCTURE

[75] Inventors: Edward August Giess, Somers; George Edward Keefe, Montrose; Yeong Show Lin, Mount Kisco, all of N.Y.

[73] Assignee: International Business Machines Corporation, Armonk, N.Y.

[21] Appl. No.: 645,737

[22] Filed: Dec. 31, 1975

[51] Int. Cl.² .............................................. G11C 19/08
[52] U.S. Cl. ........................................ 365/36; 365/33
[58] Field of Search .................................. 340/174 TF

[56] References Cited

U.S. PATENT DOCUMENTS

| | | | |
|---|---|---|---|
| 3,828,329 | 8/1974 | Fischer et al. | 340/174 TF |
| 3,967,002 | 6/1976 | Almasi et al. | 340/174 TF |
| 3,996,572 | 12/1976 | Keefe et al. | 340/174 TF |
| 3,996,573 | 12/1976 | Singh | 340/174 TF |

OTHER PUBLICATIONS

AIP Conference on Magnetism & Magnetic Materials, Nov. 28–Dec. 1, 1972; Denver, Colorado, pp. 339–343.

IEEE Transactions on Magnetics, vol. Mag.-9, No. 3, Sept. 1973, pp. 514–517.

*Primary Examiner*—James W. Moffitt
*Attorney, Agent, or Firm*—Jackson E. Stanland

[57] ABSTRACT

An improved ion implanted propagation structure for movement of magnetic bubble domains in a storage medium which comprises an additional magnetic layer capable of ion implantation in combination with a bubble domain storage layer in which the bubble domains exist and are moved by the ion implanted layer in response to the reorientation of a magnetic field in the plane of the ion implanted layer. The ion implanted layer (drive layer) can be in intimate contact with the storage layer and exchange coupled thereto, or can be separated from the storage layer by a non-magnetic spacer. The ion implanted layer can comprise different geometry propagation elements and its thickness, $4\pi M$, and other magnetic properties are generally selected to provide flux matching of a charged wall in the ion implanted layer with the flux emanating from the bubble domains to be moved. The charged wall is coupled to the bubble domain by exchange coupling and/or magnetostatic coupling.

7 Claims, 21 Drawing Figures

ION IMPLANTED BUBBLE PROPAGATION STRUCTURE

BACKGROUND OF THE INVENTION

1. Field of the Invention

This invention relates to propagation structures for moving magnetic bubble domains, and more particularly to improved ion implanted propagation structures for moving magnetic bubble domains in materials which are not easily ion implanted.

2. Description of the Prior Art

The use of ion implantation to affect the surface layer of a magnetic bubble domain material for hard bubble suppression and for propagation of domains is known in the bubble domain art. For instance, reference is made to U.S. Pat. No. 3,792,452 which discusses the alteration of magnetic anisotropy by ion implantation, and U.S. Pat. No. 3,828,329 which relates to the use of ion implanted regions as propagation elements for moving magnetic bubble domains. In addition, Wolfe et al, Applied Physics Letters, July 1974, discusses magnetic closure domains in ion implanted surfaces and the propagation of magnetic bubble domains in the material whose surface is ion implanted.

Other references which relate to the provision of hard bubble suppression layers are U.S. Pat. No. 3,836,898 and Y. Hidaka et al, AIP Conference Proceedings, No. 24, p. 633, 1975. This is the proceedings of the 20th Annual Conference on Magnetism and Magnetic Materials, held at San Francisco, California, on Dec. 3-6, 1974. The first of these references describes a bubble domain structure which utilizes two garnet layers separated by a thin non-magnetic epitaxial layer. Magnetostatic coupling exists between bubble domains in the two garnet layers although these layers are not exchange coupled to one another. If desired, the top garnet layer can be ion implanted to suppress hard bubbles in that top layer. The Hidaka et al reference describes the use of a thin YIG layer having high in-plane magnetization over a bubble domain garnet material. The propagation structure is permalloy. The YIG layer acts to improve the propagation margins of the permalloy structure and is therefore a keeper layer such as that which is known in the art.

Whereas ion implantation for both hard bubble domain suppression and propagation elements is known in magnetic bubble technology, certain bubble domain materials, and especially those having very small bubble domains, are not readily ion implanted. For example, many magnetic garnets which support one micron and smaller magnetic bubble domains cannot be successfully ion implanted to provide regions therein having in-plane magnetization. However, these are desirable bubble domain materials since they provide small bubble domains which are stable under varying conditions of magnetic bias field and temperature. In contrast with this, many bubble materials which are readily ion implantable have low Q factor ($Q = H_k/4\pi M_s$) and poor temperature and bias field sensitivities. For example, Gd iron garnets are generally good for ion implantation but have Q factors close to unity, and thus bubble domains in them are quite unstable. On the other hand, Eu iron garnets have Q factors of about 3 or 4 and are often good for temperature and bias stability in very small micron bubble domain materials. However, they are extremely difficult, if not impossible, to successfully ion implant.

The ability to be able to ion implant a material appears to be related to the magnetic and physical properties of the material. In particular, the material should have magnetostrictive coefficients such that ion implantation will produce an in-plane magnetic anisotropy. Furthermore, materials having low $Q = H_k/4\pi M_s$ generally are easier to implant since the uniaxial anisotropy constant $K_u$ is smaller than in materials having high Q.

In order to solve this problem, Applicants have appreciated the fact that bubble propagation due to ion implanted structures occurs because the bubble domains are coupled to a charged wall created when an in-plane magnetic field is applied to the bubble material having ion implanted regions therein. As the in-plane magnetic field reorients, the charged wall moves and therefore brings the coupled bubble domain along with it. Because this is the mechanism for movement with ion implanted propagation structures, Applicants appreciated that a separate drive layer can be provided for use with bubble domain materials which are not readily implantable. Therefore, ion implanted propagation elements, such as contiguous disk shaped elements, can be provided for movement of bubble domains in these favorable (but hard-to-implant) bubble materials by using a second magnetic layer that is readily implantable. This second layer, or drive layer, can be in exchange coupling contact with the storage layer in which bubble domains exist, or can be separated from the storage layer by a non-magnetic spacer having a thickness less than that which would adversely affect the magnetic coupling between the charged wall and the coupled bubble domain.

The provision of a separate drive layer of different chemical formula which is ion implantable is not suggested by the prior art, which chooses separate ion implanted magnetic layers only for hard bubble suppression. The prior art does not show or suggest the provision of an ion implantable second magnetic layer of different chemical formula (composition) than the storage layer, which is used to drive magnetic bubble domains in the storage layer. Further, it would appear that the structure of the present invention would have to operate in a magnetic bias field that is 2-3 times greater than the $4\pi M$ of the driving layer in order to stabilize the size of the very small bubble domains in the storage layer. It would usually be expected that this would cause the in-plane magnetization of the ion implanted regions to be forced from that orientation to a perpendicular orientation which would in turn cause loss of the necessary magnetic properties for movement of bubble domains. However, experimentation has shown that the magnetization of the ion implanted drive layer remains in-plane even in the presence of high bias fields which are required to stabilize very small bubble domains in the associated storage layer. Thus, an operable structure is provided where, at first glance, it would have been thought that the ion implanted drive layer would not be able to retain the properties necessary for propagation of bubbles in a storage layer.

Aforementioned U.S. Pat. No. 3,828,329 shows a double layer structure (FIG. 9) where ion implanted regions in layer 53 are used to drive bubble domains in layer 51. However, that teaching differs from the teaching of the present invention since the structure of the cited patent uses bubble materials which are readily ion implantable. In contrast with this, the present invention provides ion implanted propagation structures for moving magnetic bubble domains in materials which are not readily and successfully ion implanted. The storage layer in Applicants' invention is not easily and readily implantable because of the high stability of this layer. The magnetization of the bubble layer cannot be reliably and reproducibly flipped over to be in-plane.

Thus, the prior art uses materials which are ion implantable and which appear to have the same chemical formula, in contrast with Applicants' invention where non-implantable materials are used as storage layers and where the chemical formula of the drive layer is different than that of the storage layer.

Accordingly, it is a primary object of the present invention to provide improved ion implanted propagation structures for use with magnetic bubble domain materials which are not readily ion implantable.

It is another object of the present invention to provide improved apparatus for moving magnetic bubble domains in bubble domain storage layers capable of supporting bubble domains of one micron and less.

It is a further object of this invention to provide techniques for producing ion implanted propagation structures for movement of magnetic bubble domains in magnetic materials that cannot be readily ion implanted, where propagation of the bubble domains is enhanced by flux matching to a charged wall in an ion implanted layer.

BRIEF SUMMARY OF THE INVENTION

Propagation of magnetic bubble domains in bubble domain materials that are not readily successfully ion implanted is achieved by providing a separate magnetic layer, termed a drive layer, which can be ion implanted. This drive layer can be in exchange coupled proximity to the bubble domain layer (storage layer) or can be separated therefrom by a non-magnetic layer. In contrast with the storage layer, the drive layer is chosen to be a magnetic material which can be readily ion implanted to provide regions having in-plane magnetization. These regions of in-plane magnetization comprise the propagation elements for movement of magnetic bubble domains therealong in the associated bubble storage layer. Propagation in this manner proceeds by application of a reorienting magnetic field in the plane of the drive layer.

Applicants have discovered that propagation of bubble domains by ion implanted structures occurs through the mechanism of charged wall coupling, in which a bubble domain is coupled to a charged wall in the ion implanted drive layer. Thus, as the in-plane magnetic field reorients, the charged wall moves along the ion implanted propagation structure and pulls the coupled magnetic bubble domain therealong.

In order to enhance propagation of bubble domains by ion implanted structures, flux matching should be achieved between the charged wall and the magnetic bubble domain. Thus, the ratio $\phi_B\phi_{CW}$, where $\phi_B$ is the magnetic flux from the bubble domain and $\phi_{CW}$ is the magnetic flux from the charged wall, should be between about 1 and about 10 in order to have maximum coupling and most efficient bubble propagation. The concept of charged walls for movement of magnetic bubble domains in ion implanted structures is described by G. S. Almasi et al in the AIP Conference Proceedings, No. 24, p. 630, 1975. This is the proceedings of the 20th Annual Conference on Magnetism and Magnetic Materials, held December 1974, at San Francisco, California. This paper by Almasi et al is entitled "Bubble Domain Propagation Mechanisms in Ion-Implanted Structures."

In order to obtain maximum flux coupling, the thickness of the drive layer, its $4\pi M_s$, etc., can be selected to provide the proper flux $\phi_{CW}$ in the charged wall. Additionally, these properties in the storage layer can be suited to the drive layer, although the storage layer is usually chosen in accordance with its bubble domain properties, after which the drive layer is suitably chosen to provide a charged wall having the proper flux and to provide a drive layer that is readily ion implantable.

As will be apparent to one of skill in the art, the geometries of the ion implanted propagation elements can be of numerous types, including circular disk shaped elements, diamond shaped elements, etc. Additionally, the ion implanted propagation elements can be contiguous to one another or separated from one another.

These and other objects, features, and advantages will be more apparent from the following more particular description of the preferred embodiments.

BRIEF DESCRIPTION OF THE DRAWINGS

FIG. 2A is a cross-sectional illustration of an ion implanted magnetic layer, while

FIGS. 5A–5H illustrate ion implantation of the drive layer, while

DETAILED DESCRIPTION OF THE PREFERRED EMBODIMENTS

Figure 1:
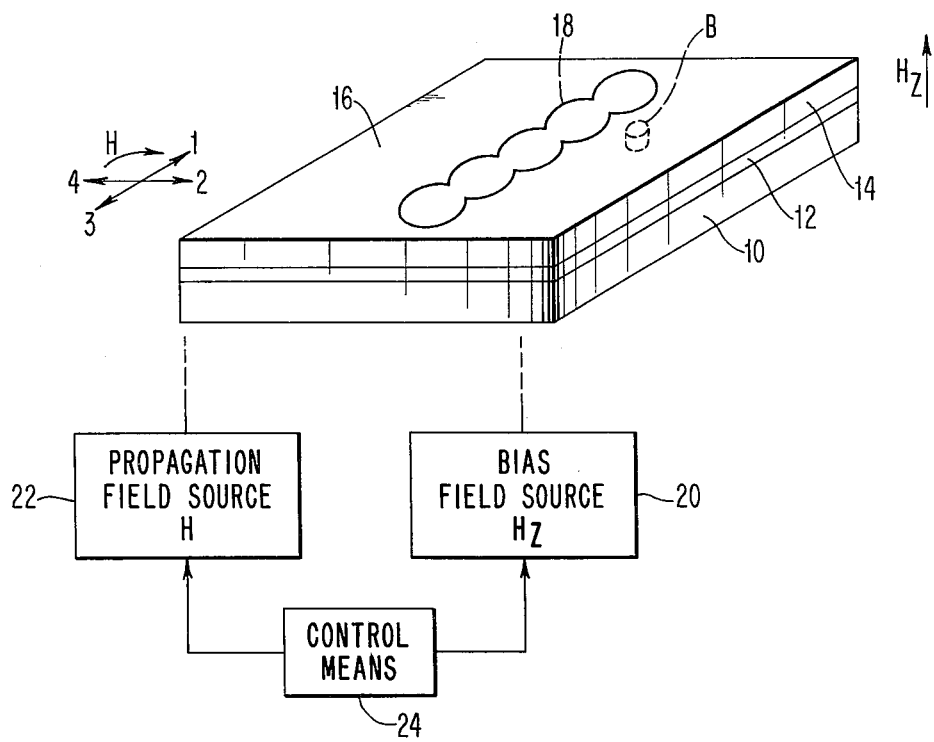
FIG. 1 is an illustration of a bubble domain propagation structure using a storage layer and an ion implantable drive layer in accordance with the principles of the present invention.

FIG. 1 is a schematic illustration of a bubble domain device in accordance with the principles of the present invention. A substrate 10 has a magnetic bubble domain material 12 thereon. In a preferred embodiment, the substrate is a non-magnetic material having a garnet structure while the bubble domain layer 12 is a magnetic material having a garnet structure and which is capable of supporting very small bubble domains of the order of one micron or less. These materials will be illustrated in the examples to follow, but it should be noted that the present invention is not limited to bubble domain materials having bubble domains in this particular size range. However, it is exactly these materials which are most difficult to ion implant.

Located over bubble material 12 is the magnetic drive layer 14, comprised of a material which is readily ion implantable. Thus, substrate 10 may be a garnet such as $Gd_3Ga_5O_{12}$, while the bubble storage layer 12 can typically be a Eu-based iron garnet. The overlying drive layer can be, for instance, a Gd iron garnet composition.

The top surface of drive layer 14 is shown having ion implanted regions 16 therein. The portions 18 of drive layer 14 are not ion implanted in this drawing and therefore bubble domains B in the storage layer propagate in areas of layer 12 under the ion implanted region 16, and along the periphery between the implanted region 16 and the non-implanted regions 18. Bubble domain propagation in this manner occurs in response to reorientations of the magnetic field H in the plane of drive layer 14.

The drive layer 14 can be exchange coupled to storage layer 12 and, if this is so, hard bubble suppression in storage layer 12 will result. Although not shown in this drawing, a non-magnetic spacer layer such as $Gd_3Ga_5O_{12}$ can be located between storage layer 12 and drive layer 14. This non-magnetic spacer layer would break up the exchange coupling between layers 12 and 14 and therefore hard bubble suppression would not be achieved in storage layer 12.

The size of the bubble domains B in layer 12 is controlled by the magnitude of the perpendicular bias field $H_z$, as is well known. Field $H_z$ is provided by the bias field source 20 which could be, for instance, a permanent magnet, an exchange coupled layer, or a current carrying coil. The propagation field H is provided by the propagation field source 22, also as is well known in the art. Field sources 20 and 22 are conveniently operated under control of the control means 24. Control 24 can also be used to synchronize the operation of bubble devices such as generators, sensing elements, and transfer switches as is well known. These other elements are not shown here for ease of illustration and to better focus on Applicants' contribution.

Since the drive layer 14 has a different chemical formula than that of the storage layer 12, it is possible to make a drive layer which is very compatible to ion implantation along with a storage layer which has high stability and Q-factor $Q_S$. In a preferred embodiment, the Q-factor $Q_S$ of the storage layer is greater than the Q-factor $Q_D$ of the drive layer. Additionally, $Q_D$ has a value such that the magnetization of the drive layer is initially perpendicular to the plane of the drive layer but is flipped in-plane by ion implantation. This insures that propagation elements can be defined in the drive layer. After ion implantation, the effective $H_k$ (anisotropy field) of the ion implanted regions of the drive layer is less than zero to insure that planar anisotropy exists. Also, the magnitude of the effective anisotropy field $H_k$ of the implanted portions of the drive layer is greater than the operating bias field $H_z$ used to stabilize domains in the composite structure shown in FIG. 1. This insures that the ion implanted regions of the drive layer will maintain their magnetization in the plane of the drive layer, rather than having this magnetization revert to directions normal to the plane of the drive layer when the operating bias field is applied.

In FIG. 1, the drive layer 14 is a different material than that comprising the storage layer 12. This can be accomplished by growing a drive layer of different composition on the storage layer 12 using a different chemical system, or can be done using the same chemical system in limited cases. An example of the latter case is the growth of a bubble domain storage layer 12 by liquid phase epitaxy using a given chemical system in which the growth parameters are modified to provide the drive layer 14. For example, the storage layer can comprise rare earth gallium-substituted iron garnets while the drive layer can comprise the same rare earth gallium-substituted iron garnets having a different iron/gallium ratio. During liquid phase epitaxy, the storage layer is grown and then the growth temperature is increased to grow the drive layer. If substrate rotation is used during growth, the rotation can be slowed when growing the drive layer. Slower growth of the drive layer will occur than for the storage layer, and the drive layer will have lower $4\pi M$ and significantly lower anisotropy. Therefore, a structure will be provided in which the drive layer has a low Q of approximately 1, while the storage layer has a high Q of approximately 5. The drive layer can be ion implanted to provide regions having in-plane magnetization.

In this example using SmTm iron garnets, the storage layer could not be readily implanted since its magnetization cannot be flipped to be in-plane. However, the magnetic properties of the drive layer are such that it can be readily implanted to provide ion implanted propagation elements for moving magnetic bubble domains in the storage layer. Also, the drive layer will have a low coercivity which is generally required for effective magnetic drive layers, as is known in the art.

Figure 2A:
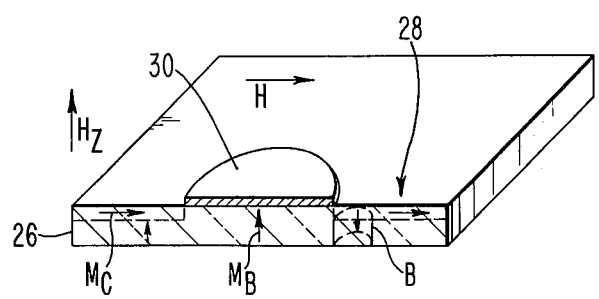
Figure 2B:
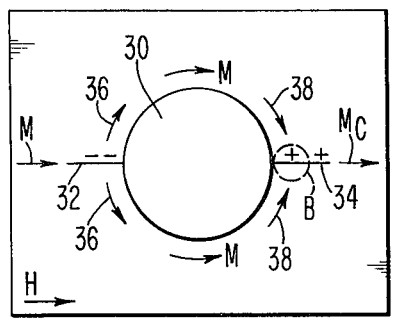
FIG. 2B is a top view of the structure of FIG. 2A, which illustrates the formation of a charged wall and the location of a bubble domain with respect to the charged wall.

FIGS. 2A and 2B

FIG. 2A is a cross-sectional view of a magnetic bubble domain material 26 which has been implanted in surface regions 28 surrounding the ion implantation mask 30. Mask 30 is comprised of a material which will prevent the bombardment of the bubble material 26 by the incoming ions and could be, for instance, a layer of gold. The magnetization $M_B$ of the bubble material is normal to the film plane, while the magnetization $M_C$ of the ion implanted areas is in the plane of layer 26. For purposes of illustration, a bubble domain B is shown in layer 26.

FIG. 2B shows the magnetization direction in the ion implanted region 28 when an external magnetic field H is applied in the direction indicated. The magnetization $M_C$ diverges and flows around the non-implanted region 30 in a manner similar to that of a slow stream of water flowing around a boulder. This forms a diverging wall 32 upstream and a converging wall 34 downstream. That is, the magnetization vectors 36 are directed oppositely to each other to form the divergent wall, while the magnetization vectors 38 are directed toward one another to form the converging wall 34. In accordance with the reference standards chosen, the converging wall is indicated by the plus (+) signs.

For bubble domains with down magnetization as indicated in FIG. 2A, the plus charged wall 34 is attractive to them. This converging wall has magnetic flux associated with it which is directed downwardly in a direction parallel to the magnetization of the bubble domain. Therefore, it is energetically attractive for the bubble domains and the bubble domain will stay at the charged wall to which it is coupled. Of course, if the magnetization of the bubble domain were in the opposite direction (up) then the bubble domain would be attracted to and coupled to the divergent wall 32.

For more information concerning the concept of charged wall propagation, reference is made to the aforementioned article by G. S. Almasi et al.

FIG. 3

Figure 3:
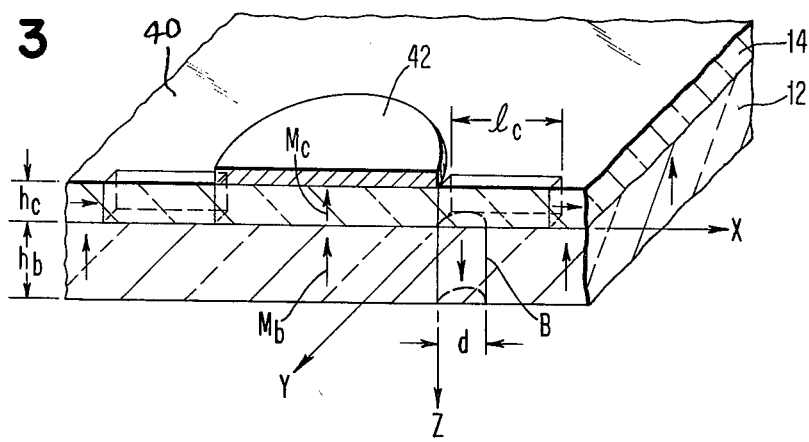
FIG. 3 is an illustration of the structure and parameters used to compute the flux $\phi_{CW}$ associated with the charged wall.

FIG. 3 is an illustration of the structure used to calculate the magnetic flux in the charged wall and that in the bubble domain, in order to determine the ratio between the two which is desirable for coupling between the bubble domain B and the charged wall. In this diagram, the reference numerals used in FIG. 1 will be used whenever possible. Accordingly, the bubble domain material 12 comprising the storage layer is located on a substrate which is not shown in FIG. 3. The drive layer 14 is the layer which is ion implanted to provide the propagation elements for moving bubble domains B in the storage layer. Drive layer 14 is ion implanted in regions 40 surrounding the ion implantation mask 42. The magnetization of the storage layer 12 is designated $M_b$ while the magnetization of the drive layer is designated $M_c$. The thickness of the drive layer is $h_c$ while the thickness of the storage layer is $h_b$. The diameter of the bubble domain coupled to the charged wall 44 is $d$. Due to the ion implantation, the magnetization $M_c$ of the drive layer is parallel to the plane of layer 14 in regions where it is ion implanted.

For the purpose of this calculation, it is assumed that the charged wall is similar to a rectangular bar having length $l_c$ and height $h_c$. The bubble domain flux $\phi_B$ is given by the following expression:

$$\phi_B \approx 1.2 \, (\pi d^2/4) \, (4\pi M_b) \tag{1}$$

The magnetic flux $\phi_C$ associated with the charged wall that is interacting with the domain B is given by:

$$\phi_{CW} \approx 2(4\pi M_c) \, h \cdot d \tag{2}$$

From these, the ratio of $\phi_B/\phi_{CW}$ can be readily calculated. Although it is desirable to have the ratio $\phi_B/\phi_{CW} \approx 1$ for maximum flux matching, this ratio can vary from about 1 to about 10 with good results. This ratio can vary over a wide range particularly when gapless propagation structures are fabricated by ion implantation, since the trapping force normally associated with gapped propagation elements (such as T and I bars) is not present. For gapped propagation elements, more close flux matching is desirable.

From these expressions, various design parameters are evident. For instance, the quantities $M_b$ and $M_c$ can be set as well as the depth of implantation $h_c$ and the bubble diameter $d$. Generally, the storage layer 12 is chosen ahead of time which fixes $M_b$, $d$ and $h_b$. This means that the properties of the drive layer, such as the depth of implantation $h_c$ and the magnetization $M_c$ are adjusted to provide the required flux matching while at the same time providing a layer which is easily implanted. As a consideration, it is generally easier to implant magnetic garnets which have low $4\pi M$, and shallow depths of implantation are also easier to achieve. As the $(4\pi M_b)$ of the storage layer increases, more drive is required to move bubble domains in that layer, so the depth of ion implantation $h_c$ generally increases to provide a strong enough charged wall. It is generally well known among those of skill in the art to adjust quantities such as $4\pi M$ by such techniques as dopants in the tetrahedral or octahedral lattice sites of the garnet. For instance, the moment $4\pi M$ of a garnet can be increased by using Fe in all of the available tetrahedral and octahedral lattice sites; in turn, this allows the use of thinner drive layers. Consequently, a 0.5 micron thick drive layer can be used to drive bubble domains in the storage layer. This means that the overlying circuits, such as magnetic sensors and conductors over the drive layer 14 are closer to the storage layer 12, which is desirable.

It is important to note that the drive layer does not need to be a magnetic material which is stable from a bubble domain standpoint. That is, the temperature and bias field stability of the drive layer are not so critical as they are for the storage layer. Its function is that of a drive layer for moving bubble domains in the underlying storage layer and, if exchange coupled to the storage layer, also acts as a hard bubble suppression layer.

FIGS. 4A-4E

These FIGS. show the movement of a bubble domain B in a storage layer 12 in response to the reorientation of in-plane magnetic drive field H. The converging walls 46, which are attractive to bubble domains in this example, are shown by the heavy lines while the diverging walls 48 are shown as narrow lines. The layer 14 is ion implanted in regions 50 outside of the ion implant mask (disk 52).

Figure 4A:
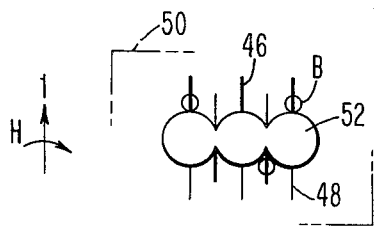
FIGS. 4A–4E illustrate the propagation of bubble domains by charged walls produced by convergence and divergence of magnetization in an ion implanted structure, in response to the application of different orientations of an in-plane magnetic field.
Figure 4B:
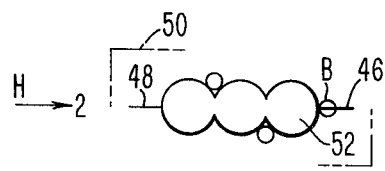
Figure 4C:
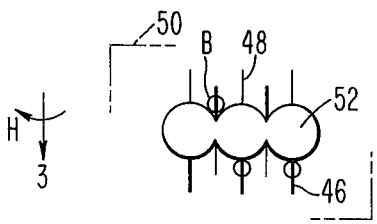
Figure 4D:
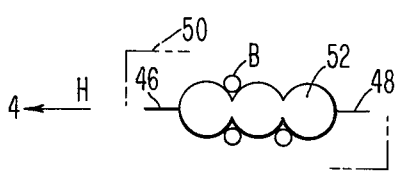
Figure 4E:
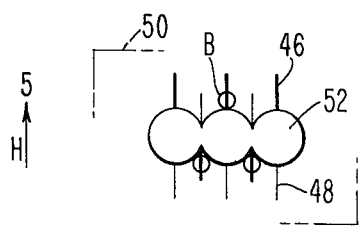

From FIGS. 4A-4E, it is evident that the bubble domains B follow the charged walls as the walls move around the periphery of the ion implanted regions. As the in-plane field H rotates, the charged walls at the wide parts of the propagation pattern move to the narrow parts (the cusps) and disappear (FIG. 4B), only to reappear on the other side of the propagation track 180° later (FIG. 4C). A 360° rotation of field H completes one propagation step although the bubbles B spend most of that time in the cusp. This explains why the bubble is not repelled from the cusp after it arrives there.

In creating the implanted regions 50, the ion species, energy, and dosage can be varied to provide different types of ion implanted regions. These are well known from theory and practice. The propagation of bubbles by ion implanted regions having in-plane magnetization requires that the in-plane magnetic field H should be strong enough to switch the magnetization of the implanted layer. Unlike a permalloy layer in which the anisotropy energy is negligible during magnetization reversal, a cubic anisotropy energy is dominant in the implanted regions 50. To rotate the magnetization in the implanted layer, the in-plane magnetic field H should overcome the effective cubic anisotropy field, as is known.

FABRICATION PROCESS (FIGS. 5A-5I)

Figure 5A:
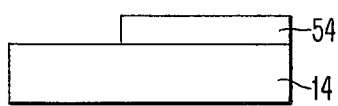
Figure 5B:
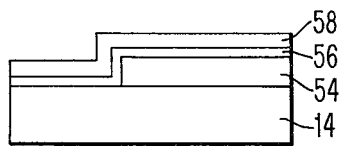

These FIGS. indicate a suitable fabrication process for making a complete bubble domain device. In these FIGS., only the drive layer 14 is shown, it being understood that the storage layer 12 is located either in contact with layer 14 or separated therefrom by a thin spacer layer. In FIG. 5A, a resist mask 54 is deposited on layer 14. This mask is used to form the ion implanted propagation means. In FIG. 5B, an ion implantation mask comprising a layer 56 of Cr and a layer 58 of Au has been deposited.

Figure 5C:
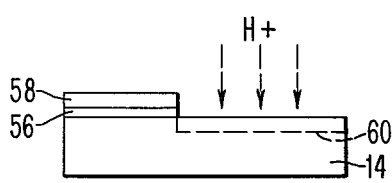
Figure 5D:
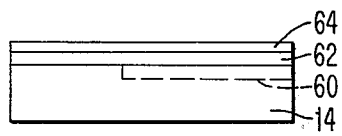

Resist 54 is then removed and drive layer 14 is ion implanted using, for example, H+ ions, to create the ion implanted regions 60 (FIG. 5C). After this, layers 56 and 58 are removed and a layer 62 of an insulator such as SiO$_2$ is deposited. After this, a layer 64 of magnetic material, such as NiFe, is deposited on layer 62. Layer 64 is used for the sensor, generator, and annihilator devices in a manner well known in the art.

Figure 5E:
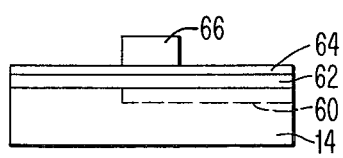
Figure 5F:
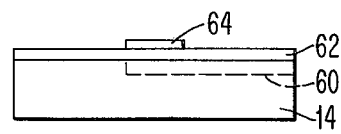
Figure 5G:
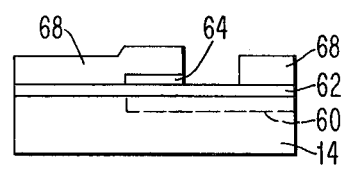

In FIG. 5E, a second resist mask 66 is provided for delineation of the sensor, generator and annihilator circuits. Thus, regions of layer 64 are removed except under mask 66 (FIG. 5F). A third mask 68 is then provided which is used to define the transfer line, read/write control lines, etc. Thus, in FIG. 5H, a control line 70 is deposited over an insulating layer 72.

Figure 5H:
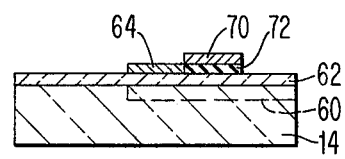
Figure 5I:
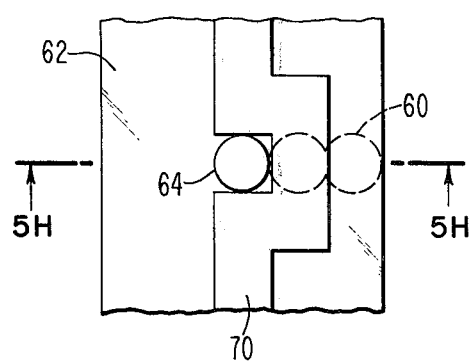
FIG. 5I illustrates the type of structure which can be provided by the fabrication process of FIGS. 5A–5H.

FIG. 5I is a top view of the structure made by the steps shown in FIGS. 5A–5H, where the arrows 5H indicate the line of viewing for the cross-section shown in FIG. 5H.

PROPAGATION ELEMENT DESIGNS (FIGS. 6A–6C)

As was indicated previously, the geometries of the ion implanted regions can be of many types depending upon the propagation that is desired. While ion implantation is particularly useful for providing contiguous disk propagation structures comprising circular regions, other geometries can be used also. In addition, disk shaped regions can be ion implanted rather than implanting areas surrounding disk shaped regions, although this is not as desirable in terms of bubble propagation.

Figure 6A:
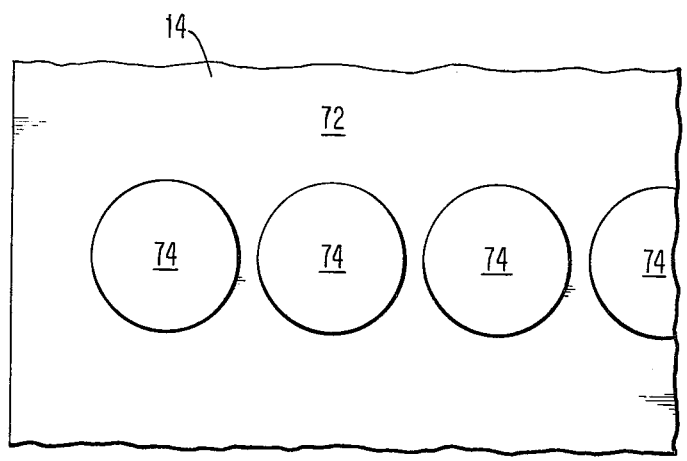
FIGS. 6A–6C show alternate geometries which can be used for the ion implanted propagation elements.

FIG. 6A shows an alternate design for the propagation elements in which the drive layer 14 is ion implanted in all regions 72 surrounding the circular region 74. In contrast with the design shown in FIG. 1, circular regions 74 do not contact one another. Although propagation using the structure of FIG. 6A is not as desirable as that shown in FIG. 1, it can be used providing the spacing A between adjacent disks 74 is about two bubble domain diameters, or less.

Figure 6B:
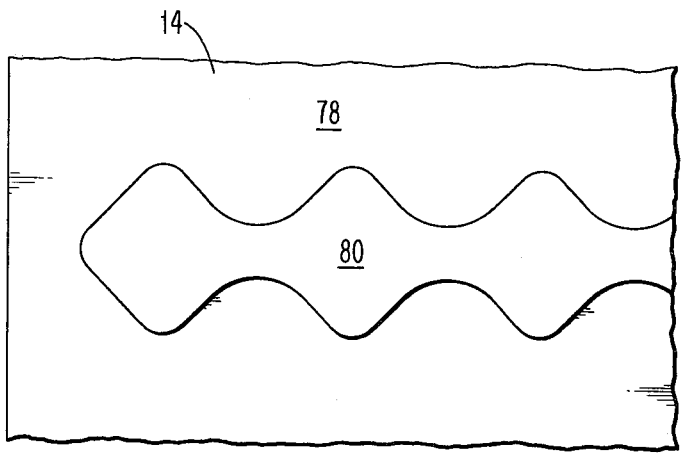

FIG. 6B shows another propagation element design comprising diamond shaped structures 76 where the regions 78 of layer 14 are ion implanted while the regions 80 are not ion implanted. The corners of the contiguous diamond structure shown in this FIG. are rounded off, but need not be for successful bubble propagation.

Figure 6C:
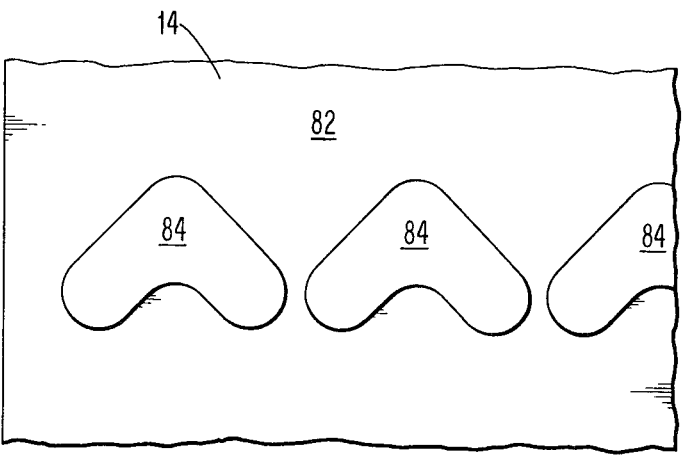

FIG. 6C shows heart-shaped or double petal shaped propagation elements in which the regions 82 of drive layer 14 are ion implanted, while regions 84 are not implanted. Although charged walls can be created in drive layer 14 when it is implanted to make the design of FIG. 6C, propagation using that design is not as reliable as that using contiguous circular disks.

While charged walls have been postulated for movement of domains by ion implanted structures, the present invention is not limited to propagation by only this mechanism. Rather, the present invention is concerned with provision of ion implanted propagation elements for movement of bubble domains in materials which cannot be readily successfully ion implanted.

EXAMPLES

The following table lists representative examples of bubble domain devices comprising a bubble storage layer and a drive layer which can be ion implanted to provide the propagation elements used to move bubble domains in the storage layer. The table gives the composition of the storage and drive layers, as well as the $4\pi M$ of each layer, thickness of each layer, and bubble domain diameter. Further, data are given concerning ion implantation of the drive layer and the rotating field and bias field used to operate devices. The pattern used for propagation is also mentioned.

| Sample No. | Thickness (microns) | $4\pi M$ Gauss | Bubble Diameter ($\mu$) | Ion Implant. Data | Implant. Depth ($\mu$) | Propagation Pattern | H(Oe) | $H_z$(Oe) |
|---|---|---|---|---|---|---|---|---|
| 1540 | | | | | | | | |
| Storage layer $Sm_{0.2}Gd_{0.6}Tm_{2.2}Ga_2Fe_{4.8}O_{12}$ | 1.29 | 800 | 1.15 | a)$H^+$,25 KeV $2\times10^{16}/cm^2$ room temp. | 0.2 | Contiguous diamonds rounded corners | 30 to 50 | 471–480 455–530 |
| Drive layer $Gd_{0.9}Tm_{1.1}YGa_{0.4}Fe_{4.6}O_{12}$ | 0.32 | 800 | | b)$H^+$,50 KeV $2\times10^{16}/cm^2$ room temp. | 0.2 | | | |
| 1382-1 | | | | | | | | |
| Storage layer $EuTm_2Ga_{0.45}Fe_{4.55}O_{12}$ | 0.85 | 732 | 1.05 | $H^+$,150 KeV $4\times10^{16}/cm^2$ room temp. | 1.2 | Contiguous discs | 30 | 287–309 |
| Drive layer $Gd_{0.9}Tm_{1.1}YGa_{0.75}Fe_{4.25}O_{12}$ | 1.26 | 190 | | | | Contiguous diamonds sharp corners | 30 | 276–302 |
| 1382-3 | | | | | | | | |
| Storage layer - same as 1382-1 | | | | $B^+$,300 KeV $1\times10^{15}/cm^2$ room temp. followed by | 0.75 | Contiguous diamond rounded edges | 30 | 50 |
| Drive layer - same as 1382-1 | | | | $H^+$,150 KeV $4\times10^{16}/cm^2$ room temp. | 0.45 | | 295 | 287–317 |

What has been described is a two-layer magnetic bubble domain device comprising a storage layer in which magnetic bubble domains exist and a drive layer which is readily ion implantable to provide a propagation structure. The bubble domains are in the storage layer, and can extend into the drive layer if these layers are exchange coupled to one another. However, this is not necessary and whether or not the bubble domains are confined in the storage layer is incidental to the present invention.

The magnetization of the ion implanted regions will stay in-plane even in the presence of large bias fields $H_z$ needed for stability of small bubble domains, if sufficient planar anisotropy is induced during implantation. Although a drive layer with high $4\pi M$ can be used, it was quite unexpected that a drive layer having a relatively low $4\pi M$ would retain its in-plane magnetization even when large bias fields are used. In the design of devices, the drive layer is chosen to have sufficient planar anisotropy when implanted to maintain its planar magnetization when subjected to the bias field needed to stabilize domains in the associated storage layer.

The compositions chosen for the storage and drive layers are picked to provide maximum operating margins in a device where the bubble domain size is usually chosen beforehand. Because the primary function of the drive layer is to provide propagation elements for movement of bubble domains in the storage layer, the magnetic properties and stability of the drive layer are not so critical as those of the storage layer. Accordingly, many factors can be varied to provide successful propagation of bubble domains, and these will be readily appreciated by those of skill in the art.

What is claimed is:

1. A double layer magnetic bubble domain storage device, comprising:

a storage layer in which stable bubble domains having diameters not exceeding about one micron exist in the presence of a stabilizing bias field $H_b$ substantially perpendicular to said storage layer, said bubble domains being moved by magnetic coupling of the domains to moving magnetic charged walls produced in a magnetic drive layer when a magnetic field is applied in the plane of said drive layer, said storage layer having magnetic properties which prevent it from being ion implanted to produce magnetic charged walls having sufficient flux to move said bubble domains, and a drive layer comprised of a magnetic medium of different chemical formula than said storage layer including propagation means for producing magnetic charged walls in said drive layer of sufficient intensity to couple to said bubble domains in said storage layer to move said coupled bubble domains when said magnetic field reorients, said drive layer having magnetic properties which do not allow stable magnetic bubble storage in said drive layer in the presence of said bias field $H_b$, where said propagation means for producing said charged walls is comprised of contiguous propagation elements formed in said magnetic drive layer which produce magnetic charged walls having sufficient flux and being sufficiently close to said bubble domains that substantial flux coupling to said bubble domains exists for movement of said bubble domains in said magnetic medium.

2. The device of claim 1, where said contiguous propagation elements define a generally undulating propagation path for said domain movement, the diameter of said propagation elements being greater than about three bubble diameters.

3. The device of claim 1, where said drive layer is magnetically exchange coupled to said storage layer.

4. The device of claim 1, where said propagation means in said drive layer includes ion implanted regions defining said contiguous propagation elements, said magnetic charged walls having a magnetic flux $\phi_{CW}$ related to the magnetic flux $\phi_B$ of said bubble domains such that $\phi_B/\phi_{CW}$ is between about one and about ten.

5. The device of claim 4, where the quality factor $Q_S$ of said storage layer is greater than the quality factor $Q_D$ of said drive layer.

6. The device of claim 5, where said storage layer and said drive layer are magnetic materials exhibiting a garnet structure.

7. The device of claim 5, where the magnetization $M_b$ of said storage layer is greater than the magnetization $M_d$ of said drive layer.

* * * * *